(12) United States Patent
Yeh et al.

(10) Patent No.: US 10,032,568 B2
(45) Date of Patent: Jul. 24, 2018

(54) PHOTOSENSITIVE ORGANIC DYES FOR DYE-SENSITIZED SOLAR CELLS

(71) Applicant: NATIONAL CHUNG HSING UNIVERSITY, Taichung (TW)

(72) Inventors: Chen-Yu Yeh, Taichung (TW); Po-Cheng Su, Tainan (TW); Chia-Wei Hsu, Taichung (TW); Chi-Lun Mai, Pingtung (TW)

(73) Assignee: NATIONAL CHUNG HSING UNIVERSITY, Taichung (TW)

( * ) Notice: Subject to any disclaimer, the term of this patent is extended or adjusted under 35 U.S.C. 154(b) by 250 days.

(21) Appl. No.: 14/330,295

(22) Filed: Jul. 14, 2014

(65) Prior Publication Data

US 2015/0294797 A1   Oct. 15, 2015

(30) Foreign Application Priority Data

Apr. 9, 2014 (TW) .............................. 103113089 A

(51) Int. Cl.
- *H01G 9/20* (2006.01)
- *H01L 51/00* (2006.01)
- *C09B 57/00* (2006.01)
- *C09B 1/00* (2006.01)

(52) U.S. Cl.
CPC ............. *H01G 9/2059* (2013.01); *C09B 1/00* (2013.01); *C09B 57/008* (2013.01); *H01L 51/006* (2013.01); *H01L 51/0052* (2013.01); *H01L 51/0064* (2013.01); *H01L 51/0071* (2013.01); *Y02E 10/542* (2013.01); *Y02E 10/549* (2013.01)

(58) Field of Classification Search
CPC ........ H01G 9/2059; H01L 51/006; C09B 1/00
See application file for complete search history.

(56) References Cited

U.S. PATENT DOCUMENTS

| | | | |
|---|---|---|---|
| 5,415,962 A | 5/1995 | Kanemaru et al. | |
| 5,422,210 A | 6/1995 | Maruyama et al. | |
| 5,853,934 A | 12/1998 | Watanabe et al. | |
| 5,853,935 A | 12/1998 | Suzuki et al. | |
| 5,876,890 A | 3/1999 | Kitamura et al. | |
| 6,326,112 B1 | 12/2001 | Tamura et al. | |
| 6,958,204 B2 | 10/2005 | Tanaka et al. | |
| 7,078,142 B2 | 7/2006 | Itami et al. | |
| 7,354,686 B2 | 4/2008 | Toda et al. | |
| 7,482,492 B2 | 1/2009 | Coggan et al. | |
| 7,485,376 B2 | 2/2009 | Suzuri et al. | |
| 7,527,903 B2 | 5/2009 | Carmichael et al. | |
| 7,597,967 B2 | 10/2009 | Kondakova et al. | |
| 7,642,029 B2 | 1/2010 | Horgan et al. | |
| 7,915,809 B2 | 3/2011 | Xu et al. | |
| 7,927,774 B2 | 4/2011 | Ogaki et al. | |
| 7,955,768 B2 | 6/2011 | Tada et al. | |
| 8,182,933 B2 | 5/2012 | Osaka et al. | |
| 8,420,284 B2 | 4/2013 | Ohshima et al. | |
| 8,513,651 B2 | 8/2013 | Mitsui et al. | |
| 2004/0242027 A1 | 12/2004 | Tanokura et al. | |
| 2005/0026059 A1 | 2/2005 | Tanaka et al. | |
| 2007/0051403 A1 | 3/2007 | Itami | |
| 2007/0099101 A1 | 5/2007 | Horgan et al. | |
| 2007/0172749 A1 | 7/2007 | Carmichael et al. | |
| 2009/0035017 A1 | 2/2009 | Tada et al. | |
| 2009/0185821 A1 | 7/2009 | Iwamoto et al. | |
| 2009/0242027 A1 | 10/2009 | Inoue et al. | |
| 2009/0284140 A1 | 11/2009 | Osaka et al. | |
| 2009/0293951 A1 | 12/2009 | Moon et al. | |
| 2010/0068635 A1 | 3/2010 | Tanaka | |
| 2010/0076205 A1 | 3/2010 | Chow et al. | |
| 2010/0187505 A1 | 7/2010 | Stoessel et al. | |
| 2010/0264406 A1 | 10/2010 | Nagao et al. | |
| 2011/0077416 A1 | 3/2011 | Nishihara et al. | |

(Continued)

FOREIGN PATENT DOCUMENTS

| | | |
|---|---|---|
| CN | 102627868 | 8/2012 |
| EP | 0376311 B1 | 4/1995 |

(Continued)

OTHER PUBLICATIONS

Zaragoza Dorwald, Side Reactions in Organic Synthesis, 2005, Wiley-VCH Verlag GmbH & Co. KGaA, Weinheim, Preface. p. IX.*
Wang et al, Angewandte Chemie International Edition, Efficient Solar Cells Sensitized by Porphyrins with an Extended Conjugation Framework and a Carbazole Donor: From Molecular Design to Cosensitization, 2014, 53, pp. 10779-10783.*
Song et al, Journal of Physical Chemistry C, Phenylethyne-Bridged Dyes for Dye-Sensitized Solar Cells, 2009, 113, pp. 13391-13397.*
Song et al., "Phenylethyne-Briged Dyes for Dye-Sensitized Solar Cells", Jul. 2009.

(Continued)

*Primary Examiner* — Paul A Zucker
(74) *Attorney, Agent, or Firm* — WPAT, PC

(57) ABSTRACT

A photosensitive organic dye is adapted to be used in a photoelectric converting device such as a dye-sensitized solar cell. The photosensitive organic dye having a structural formula (I):

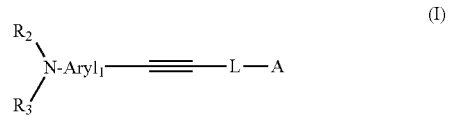

where,
$Aryl_1$ represents substituted or unsubstituted aryl with one or more aromatic rings,
$NR_2R_3$ represents a substituted electron-donating group, wherein N represents a nitrogen atom, and $R_2$ and $R_3$ independently represent identical or different substituted or unsubstituted hydrocarbon groups,
L represents an optional linker unit, and
A represents an electron-withdrawing group.

3 Claims, No Drawings

(56) References Cited

U.S. PATENT DOCUMENTS

| | | |
|---|---|---|
| 2011/0288292 A1 | 11/2011 | Parham et al. |
| 2012/0013245 A1 | 1/2012 | Johansson et al. |
| 2012/0223298 A1 | 9/2012 | Osaka et al. |
| 2012/0241728 A1 | 9/2012 | Kawakami et al. |
| 2012/0247562 A1 | 10/2012 | Nishimura et al. |
| 2012/0268840 A1 | 10/2012 | Hida et al. |
| 2012/0330025 A1 | 12/2012 | Osaka et al. |
| 2013/0160855 A1 | 6/2013 | Gibson et al. |
| 2013/0296288 A1 | 11/2013 | Pan et al. |
| 2013/0334512 A1 | 12/2013 | Abe et al. |

FOREIGN PATENT DOCUMENTS

| | | |
|---|---|---|
| EP | 0504794 B1 | 6/1998 |
| EP | 0567396 B1 | 7/1999 |
| EP | 0810480 B1 | 9/2000 |
| EP | 0821277 B1 | 12/2002 |
| EP | 0953624 B1 | 2/2004 |
| EP | 1742112 B1 | 11/2008 |
| EP | 2037528 A1 | 3/2009 |
| EP | 1898262 B1 | 12/2009 |
| WO | 2012096134 | 7/2012 |
| WO | 2013030737 | 3/2013 |

OTHER PUBLICATIONS

Song et al., "Aryl/hetero-arylethyne bridged dyes: the effect of planar π-bridge on the performance of dye-sensitized solar cells", Oct. 2010.

Taiwan Patent Office, "Search Report", dated Aug. 19, 2014.

\* cited by examiner

PHOTOSENSITIVE ORGANIC DYES FOR DYE-SENSITIZED SOLAR CELLS

FIELD OF THE INVENTION

The present invention relates to a photosensitive organic dye, and more particularly to a photosensitive organic dye for a photoelectric converting device. The present invention also relates to a dye-sensitized solar cell.

BACKGROUND OF THE INVENTION

Recently, with increasing awareness of environmental protection, the demand on renewable energy is growing. Among various renewable energy sources, solar energy is expected to replace fossil fuel as a new energy source because it provides clean energy without depletion. The solar energy may be converted into electric energy without generating contaminants. In other words, the solar energy source is the most viable renewable energy source.

Generally, a solar cell is used to convert solar energy into electric energy. The conventional solar cell is made of semiconducting materials. In particular, the silicon-based solar cell is the mainstream in the market. The photoelectric conversion efficiency and the cost-effectiveness of the conventional solar cell are gradually improved. However, the photoelectric conversion efficiency and the cost-effectiveness of the conventional solar cell are still unsatisfied so far. Consequently, many academic institutions and manufacturers devote much effort in improving the original solar cell configurations and looking for the novel solar cell configuration in order to increase the performance and reduce the fabricating cost. For example, a dye-sensitized solar cell (DSSC) is one of the candidate solar cells because the fabricating cost of the dye-sensitized solar cell is as low as one tens to one fifth of the fabricating cos of the conventional silicon-based solar cell. Moreover, since it is not necessary to produce the dye-sensitized solar cell under the high-temperature vacuum environment, the production conditions of the dye-sensitized solar cell are less stringent than the conventional silicon-based solar cell.

The dye-sensitized solar cell is a photoelectrochemical system that uses the photoexcitation of a dye-based photosensitizer to generate photocurrent through a chemical reaction. Generally, the dye-sensitized solar cell comprises a substrate, a transparent conductive film, a semiconductor film, a dye, an electrolyte and a counter electrode. The working principles will be illustrated as follows. Firstly, a titanium dioxide or zinc oxide semiconductor film is coated with a special light-absorbing dye. When the dye is irradiated by sunlight, the electrons of the dye are excited from the ground state to the excited state. The excited electrons may be injected into the conduction band of the semiconductor film so as to become free electrons. These free electrons may flow out through conducting glass or conducting plastic, which is connected with the semiconductor film. Consequently, a current is generated. The electrolyte is located at the other side of the dye. The dye molecules that lose the electrons may receive electrons from the electrolyte so as to be restored to its original state. Moreover, after the electrons are released from the dye, the electrons pass through a load and flow to a platinum electrode, which contacts with the electrolyte. Consequently, the lost electrons of the electrolyte are supplemented, and a complete loop is created. In the dye-sensitized solar cell, the structure of the photosensitive dye may influence the photoelectric conversion efficiency and the stability of the dye-sensitized solar cell. Moreover, the selection of the photosensitive dye is highly related to the cost of the dye-sensitized solar cell and even related to the development potential of the solar cell.

Therefore, the present invention provides a photosensitive organic dye for a photoelectric converting device such as a dye-sensitized solar cell. The balance between the photoelectric conversion efficiency, the stability of the solar cell, the ease of the production process and the cost effectiveness may increase the commercial competition of the dye-sensitized solar cell.

SUMMARY OF THE INVENTION

The present invention provides a photosensitive organic dye for a photoelectric converting device such as a dye-sensitized solar cell. The photosensitive organic dye has a structural formula (I):

where,

Aryl$_1$ represents substituted or unsubstituted aryl with one or more aromatic rings, NR$_2$R$_3$ represents a substituted electron-donating group, wherein N represents a nitrogen atom, and R$_2$ and R$_3$ independently represent identical or different substituted or unsubstituted hydrocarbon groups (e.g. alky groups or aryl groups), L represents an optional linker unit, and A represents an electron-withdrawing group.

The present invention also provides a photosensitive organic dye for a photoelectric converting device such as a dye-sensitized solar cell. The photosensitive organic dye comprises a central unit, an electron donor unit, a carbon-carbon triple bond unit, an optional linker unit L, and an electron acceptor unit. The central unit comprises a substituted or unsubstituted aryl with one or more aromatic rings (Aryl$_1$). The electron donor unit includes a substituted electron-donating group NR$_2$R$_3$, wherein N represents a nitrogen atom, and R$_2$ and R$_3$ independently represent identical or different substituted or unsubstituted alkyl groups or aryl groups. These units are connected as the following order: Donor-central unit (Aryl$_1$)-CC triple bond-linker-acceptor.

In an embodiment, Aryl$_1$ is selected from substituted or unsubstituted phenyl, naphthyl, anthryl or a derivative thereof (e.g. (e.g. dibenzonaphthyl)).

In an embodiment, R$_2$ and R$_3$ independently represent identical or different substituted or unsubstituted phenyl, diphenyl, anthryl or a derivative thereof.

In an embodiment, the linker unit L represents a substituted or unsubstituted unsaturated aliphatic ring or aromatic ring selected from a five or six membered ring containing a conjugated double bond or a five or six membered ring containing at least one heteroatom, wherein the at least one heteroatom is selected from sulfur, oxygen and/or nitrogen.

In an embodiment, the electron-withdrawing group A represents carboxyl, unsaturated cyclic hydrocarbon carboxyl, unsaturated cyclic hydrocarbon hydroxyl, unsaturated cyclic hydrocarbon dihydroxyl, unsaturated cyclic hydrocarbon dicarboxyl or unsaturated cyclic hydrocarbon diketone. Preferably, the electron-withdrawing group A has conjugated double bonds, for example an aromatic hydrocarbon group containing one or more aromatic rings. The unsaturated cyclic hydrocarbon group is substituted or unsubstituted. Moreover, the unsaturated cyclic hydrocarbon group may contain at least one heteroatom, wherein the at least one heteroatom is selected from sulfur, oxygen and/or nitrogen.

The present invention further provides a dye-sensitized solar cell containing the photosensitive organic dye of the present invention.

DETAILED DESCRIPTION OF THE PREFERRED EMBODIMENT

The prevent invention provides a photosensitive organic dye for a photoelectric converting device such as a dye-sensitized solar cell. When the photosensitive organic dye is irradiated by sunlight, the electrons of the photosensitive organic dye are excited from the ground state to the excited state. In addition, the energy level of the electrons in the excited state should match the energy level of the material of the semiconductor film (e.g. titanium dioxide). Consequently, the excited electrons can be transferred to the semiconductor film to generate the current. Moreover, for increasing the photoelectric conversion efficiency, the absorption spectrum range of the photosensitive organic dye should as wide as possible in order to absorb more light energy.

For meeting the above demands, the inventors of the present invention make efforts in developing novel photosensitive dyes. Fortunately, a series of novel photosensitive organic dyes are provided. These series of photosensitive organic dyes are arylamine-based dyes having the following structural formula (I):

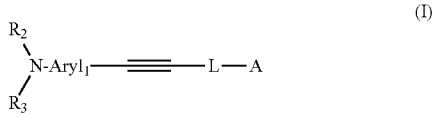
(I)

where, $Aryl_1$ represents substituted or unsubstituted aryl with one or more aromatic rings, $NR_2R_3$ represents a substituted electron-donating group, wherein N represents a nitrogen atom, and $R_2$ and $R_3$ independently represent identical or different substituted or unsubstituted alkyl groups or aryl groups, L represents an optional linker unit, and A represents an electron-withdrawing group.

Since the photosensitive organic dye has both of the electron-donating group and the electron-withdrawing group, the photosensitive organic dye is capable of pushing and pulling electrons. Moreover, the carbon-carbon triple bond of the photosensitive organic dye is serially connected between the electron-donating group and the electron-withdrawing group in order to facilitate electronic coupling and electron transfer. Under this circumstance, since the absorption spectrum of the photosensitive organic dye is widened, the efficacy of transferring electrons is enhanced and the photoelectric conversion efficiency is enhanced.

In an embodiment, the arylamine-based photosensitive organic dye contains the linker unit L. The linker unit L is connected between the carbon-carbon triple bond and the electron-withdrawing group A. The presence of the linker unit L may extend the π conjugation length. Consequently, the red shift of the photosensitive organic dye is increased, the absorption spectrum of the photosensitive organic dye is widened, and the optical absorption efficiency is enhanced. In other words, the photoelectric conversion efficiency is further enhanced. In case that the cost, the production process and other factors are taken into consideration, the linker unit L may be excluded. In the absence of the linker unit L, the structural formula of the photosensitive organic dye is expressed by the following formula (II):

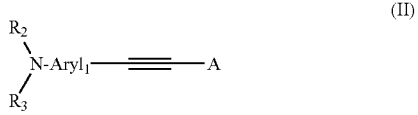
(II)

The units of the photosensitive organic dye with the formula (I) will be illustrated in more details as follows.

In the formula (I) of the photosensitive organic dye, $Aryl_1$ represents substituted or unsubstituted aryl with one or more aromatic rings. For example, $Aryl_1$ represents substituted or unsubstituted phenyl, naphthyl or anthryl, perylene, or the combination group of these aryl groups.

The examples of the photosensitive organic dye with substituted or unsubstituted phenyl, naphthyl or anthryl, perylene (i.e. $Aryl_1$) include but are not limited to those represented by the following formulae:

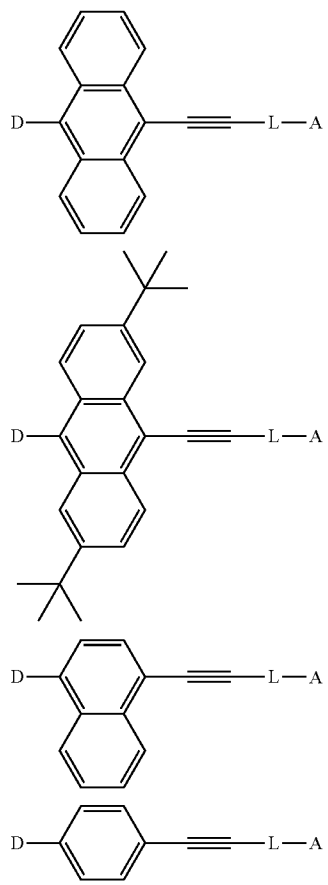

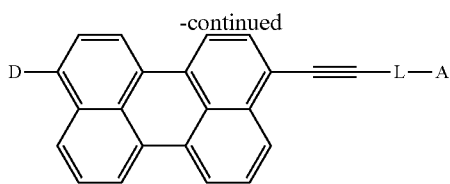

The examples of the photosensitive organic dye with the combination group of the substituted or unsubstituted phenyl, naphthyl or anthryl, perylene (i.e. $Aryl_1$) include but are not limited to those represented by the following formulae:

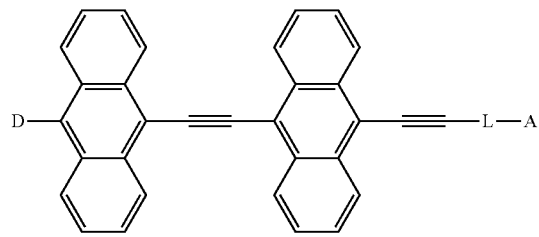

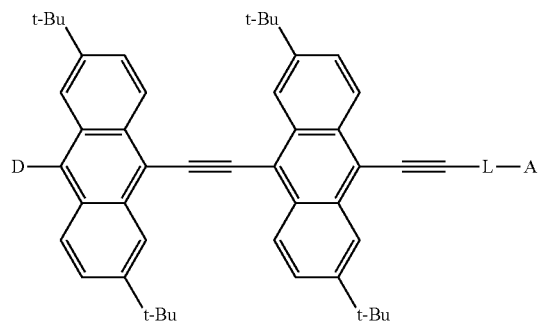

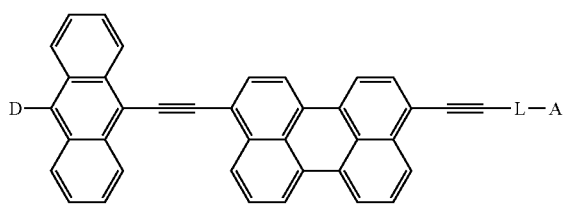

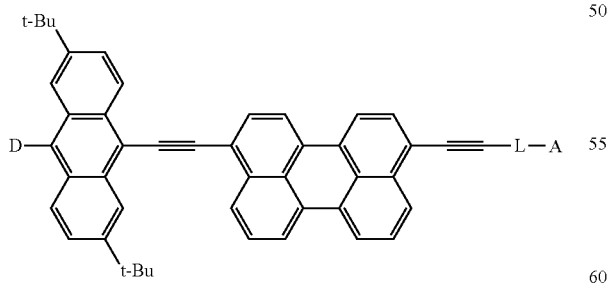

For clearly illustrating the relationships between the units of the photosensitive organic dye, in addition to the examples of $Aryl_1$, the other units (i.e. the carbon-carbon triple bond, the electron-donating group D, the linker unit L and the electron-withdrawing group A) are also shown in the above formulae. These units may have many variant examples. Moreover, the linker unit L may be selectively included in or excluded from the above formulae according to the practical requirements while the balance between the cost, the production process, the photoelectric conversion efficiency or other factors is taken into consideration.

In the formula (I) of the photosensitive organic dye, $NR_2R_3$ represents a substituted electron-donating group, wherein N represents a nitrogen atom, and $R_2$ and $R_3$ independently represent identical or different substituted or unsubstituted hydrocarbon groups. Preferably, $R_2$ and $R_3$ independently represent two aryl groups. For example, $R_2$ and $R_3$ independently represent substituted or unsubstituted phenyl, diphenyl, anthryl, or any other aryl group with substituted or unsubstituted phenyl, diphenyl or anthryl. The examples of the photosensitive organic dye with the substituted electron-donating group (i.e. $NR_2R_3$) include but are not limited to those represented by the following formulae:

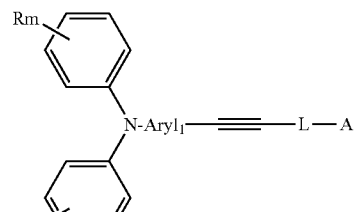

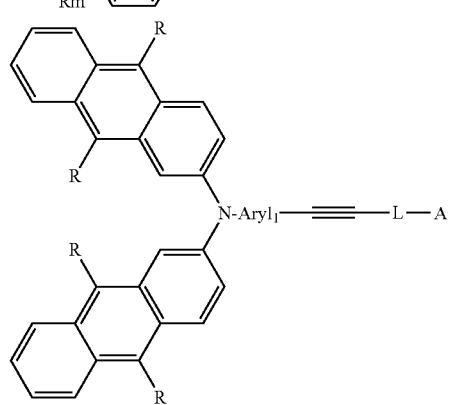

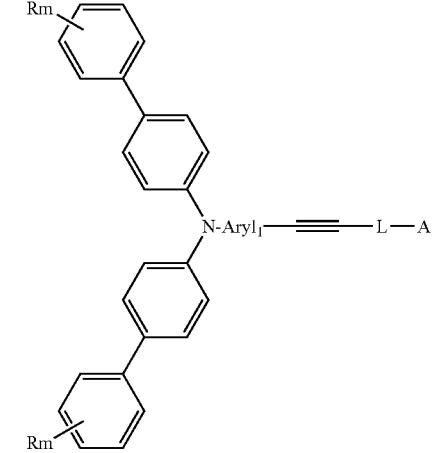

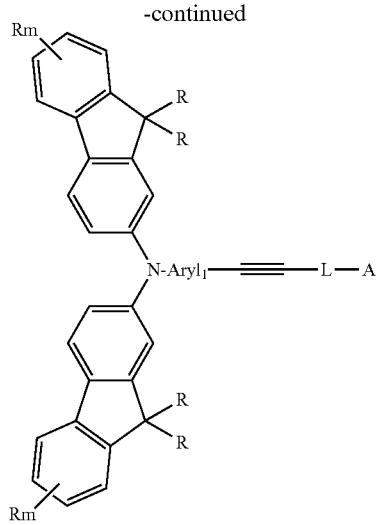

where, $R=C_nH_{2n+1}$ or $OC_nH_{2n+1}$, $n=0\sim42$, and $m=0\sim5$.

For simplifying the production process, $R_2$ and $R_3$ independently represent two identical aryl groups. While the balance between the energy gap, absorption spectrum, the stability or other factors is taken into consideration, $R_2$ and $R_3$ may independently represent two different aryl groups or other hydrocarbon groups. For clearly illustrating the relationships between the units of the photosensitive organic dye, in addition to the examples of the electron-donating group $NR_2R_3$, the other units (i.e. the unit $Aryl_1$, the carbon-carbon triple bond, the electron-donating group D, the linker unit L and the electron-withdrawing group A) are also shown in the above formulae. These units may have many variant examples. Moreover, the linker unit L may be selectively included in or excluded from the above formulae according to the practical requirements.

In the formula (I) of the photosensitive organic dye, the linker unit L represents a substituted or unsubstituted unsaturated aliphatic ring or aromatic ring selected from a five or six membered ring containing a conjugated double bond or a five or six membered ring containing at least one heteroatom, wherein the at least one heteroatom is selected from sulfur, selenium, oxygen and/or nitrogen. The examples of the photosensitive organic dye with the linker unit L include but are not limited to those represented by the following formulae:

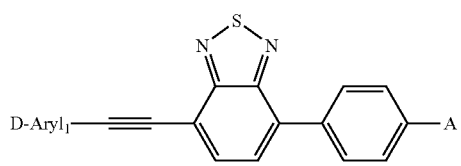

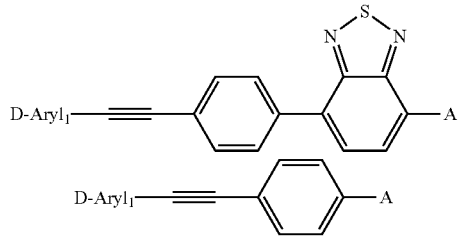

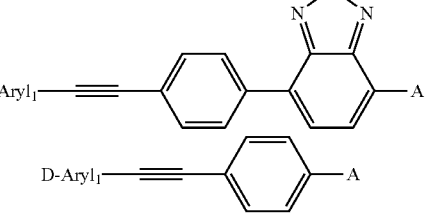

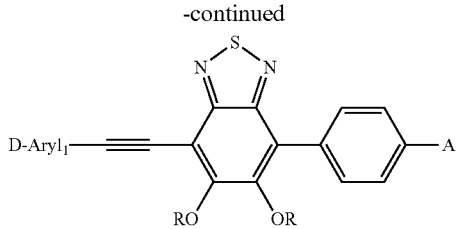

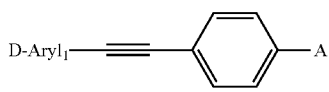

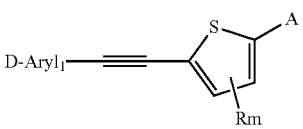

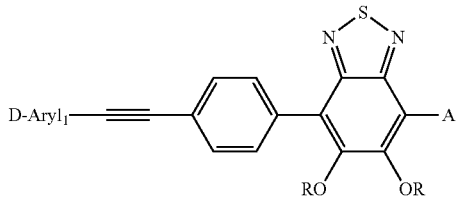

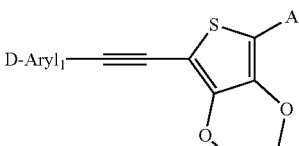

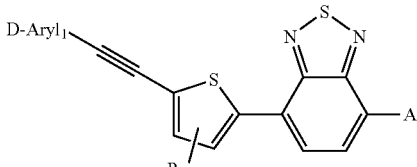

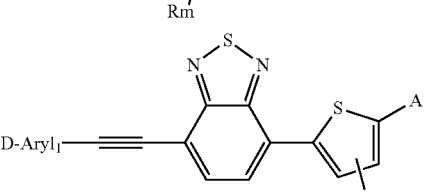

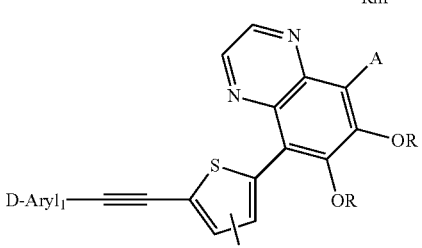

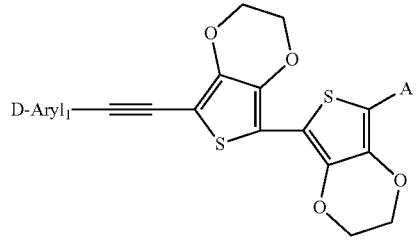

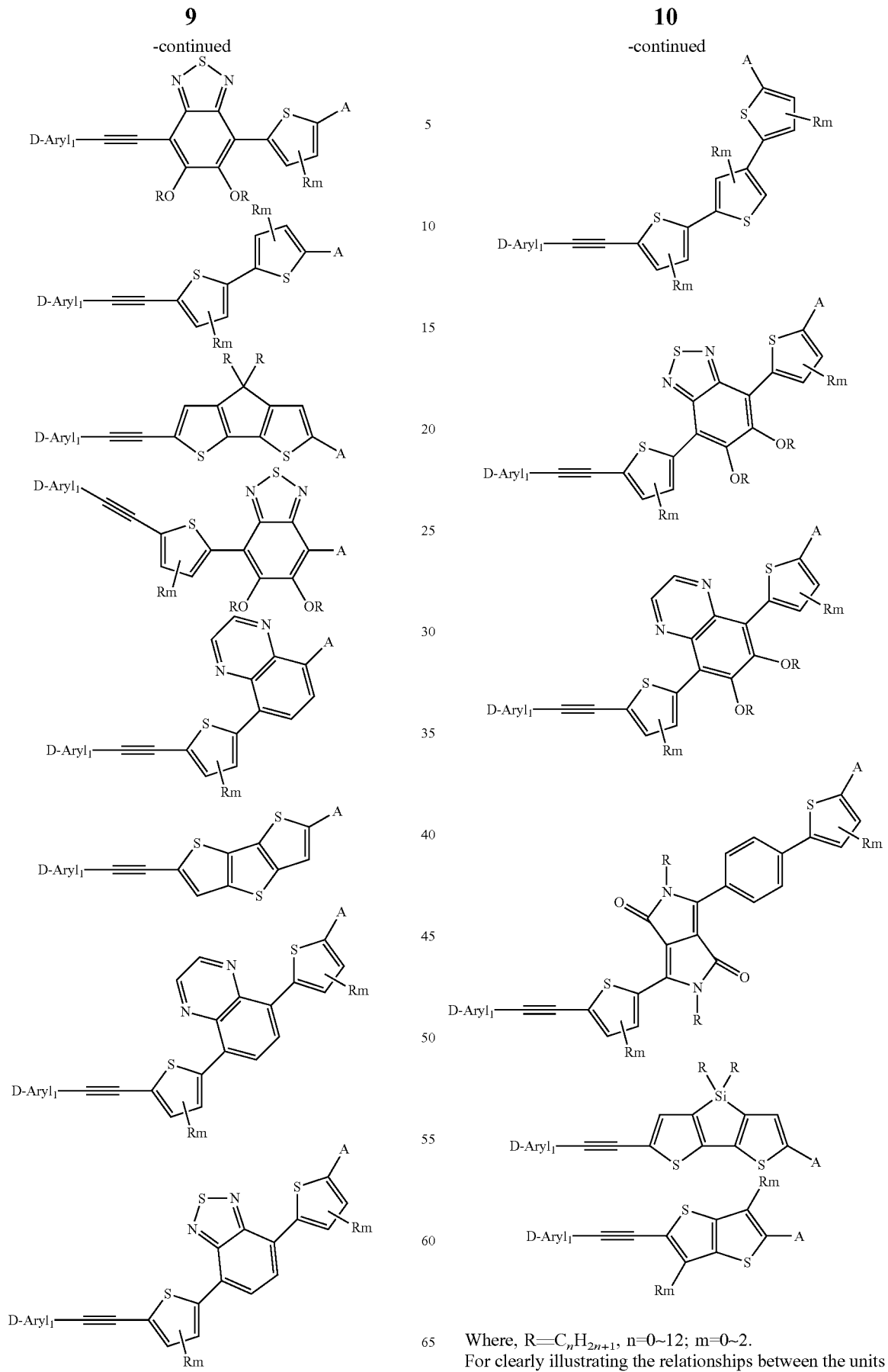
Where, R=$C_nH_{2n+1}$, n=0~12; m=0~2.
For clearly illustrating the relationships between the units of the photosensitive organic dye, in addition to the examples of the linker unit L, the other units (i.e. the unit $Aryl_1$, the carbon-carbon triple bond, the electron-donating group D and the electron-withdrawing group A) are also shown in the above formulae. These units may have many variant examples.

In the formula (I) of the photosensitive organic dye, the electron-withdrawing group A represents carboxyl, unsaturated cyclic hydrocarbon carboxyl, unsaturated cyclic hydrocarbon hydroxyl, unsaturated cyclic hydrocarbon dihydroxyl, unsaturated cyclic hydrocarbon dicarboxyl or unsaturated cyclic hydrocarbon diketone. Preferably, the electron-withdrawing group A has conjugated double bonds, for example an aromatic hydrocarbon group containing one or more aromatic rings. The unsaturated cyclic hydrocarbon group is substituted or unsubstituted. Moreover, the unsaturated cyclic hydrocarbon group may contain at least one heteroatom, wherein the at least one heteroatom is selected from sulfur, oxygen and/or nitrogen. The examples of the photosensitive organic dye with the electron-withdrawing group A include but are not limited to those represented by the following formulae:

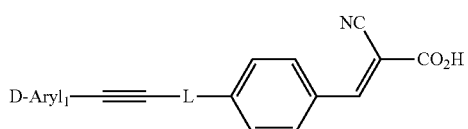
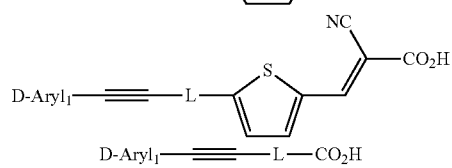
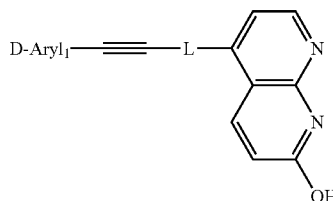
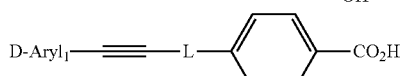
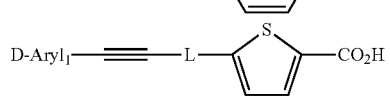
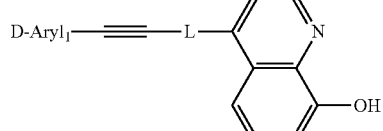
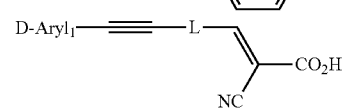
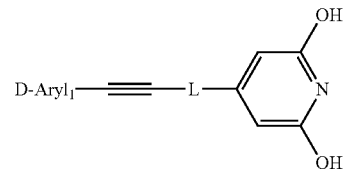

-continued

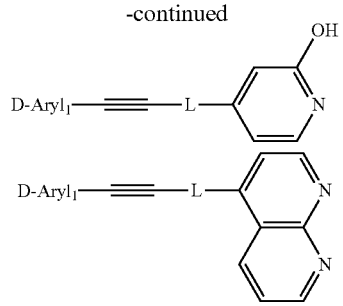
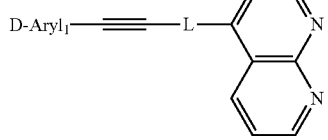
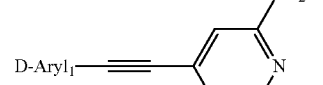
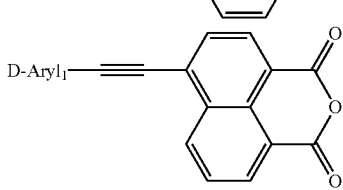
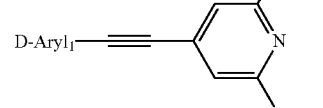
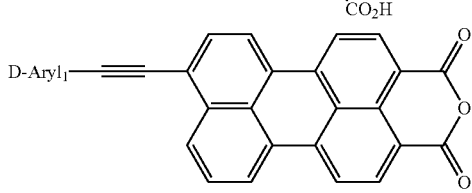

For clearly illustrating the relationships between the units of the photosensitive organic dye, in addition to the examples of electron-withdrawing group A, the other units (i.e. the carbon-carbon triple bond, the electron-donating group D, the linker unit L and the unit $Aryl_1$) are also shown in the above formulae. These units may have many variant examples. Moreover, the linker unit L may be selectively included in or excluded from the above formulae according to the practical requirements.

The unit $Aryl_1$, the electron-donating group D, the optional linker unit L and the electron-withdrawing group A in the formula (I) of the photosensitive organic dye may be determined according to the practical requirements about the desired properties. For example, in case that the molecular weights of the electron-donating group D and the electron-withdrawing group A are larger, the absorption spectrum of the photosensitive organic dye is wider. Moreover, the bifunctional groups of the electron-withdrawing group A (e.g. dihydroxyl, dicarboxyl or diketone) are helpful to the stability of the combination between the photosensitive organic dye and the semiconductor film (e.g. a titanium dioxide semiconductor film). Moreover, in case that the unit $Aryl_1$ is simpler, the fabricating cost is lower and the production complexity is reduced. For example, when the photoelectric conversion efficiency, the ease of the production process and the cost effectiveness are taken into consideration, a preferred example of the photosensitive organic dye is 4-[N,N-Bis(4-hexylphenyl)-10-(trimethylsilyl)ethynylanthracen-9-amino]benzoic acid, which is represented by the following formula (III):

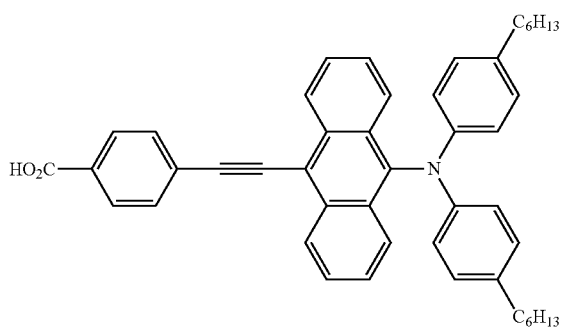

For facilitating those skilled in the art to understand the ease of the production process, the synthesis of the photosensitive organic dye with the formula (III) will be illustrated as follows. It is noted that the following synthesis is presented herein for purpose of illustration and description only. That is, the photosensitive organic dye of the present invention may be synthesized by any other appropriate method.

Firstly, a solution of a compound (IV) (144.4 mg, 0.428 mmol), 9-bromoanthracene (100.0 mg, 0.389 mmol) with Pd(OAc)$_2$ (0.9 mg, 0.004 mmol), P(t-Bu)$_3$ (0.9 mg, 0.005 mmol) and NaO-t-Bu (44.9 mg, 0.467 mmol) in 10 ml toluene was refluxed for 12 hours under nitrogen atmosphere. The solvent was removed in vacuo, and the residue was purified on a column chromatograph (silica gel) using hexanes as eluent to give a fluorescent yellow solid N,N-Bis(4-hexylphenyl)anthracen-9-amine (formula (V)) (165.8 mmg, 83%). $^1$H NMR (400 MHz, CDCl$_3$) δ 8.48 (s, 1H), 8.13 (d, J=8.6 Hz, 2H), 8.05 (d, J=8.4 Hz, 2H), 7.40 (dddd, J=9.9, 7.8, 6.5, 1.1 Hz, 4H), 7.00-6.88 (m, 8H), 2.47 (t, J=8.0 Hz, 4H), 1.58-1.48 (m, 4H), 1.36-1.24 (m, 12H), 0.91-0.82 (m, 6H). $^{13}$C NMR (101 MHz, CDCl$_3$) δ 145.7, 137.7, 135.3, 132.8, 130.8, 128.9, 128.8, 126.5, 125.4, 124.6, 119.9, 35.2, 31.7, 31.5, 29.1, 22.6, 14.1. ESI(MS): m/z: Calcd for C$_{38}$H$_{43}$N: 513.8 [M]$^+$ Found: 513.5.

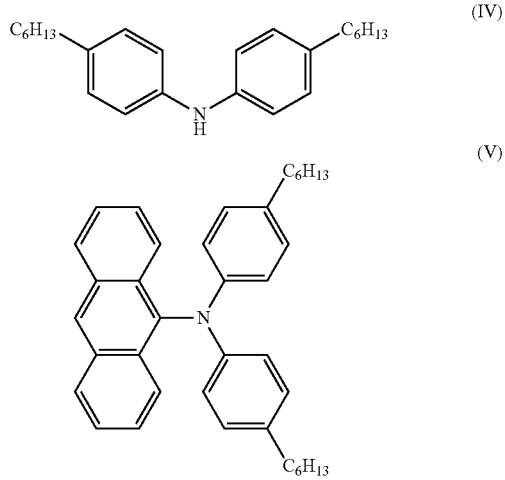

To a stirred solution of the compound (V) (100.0 mg, 0.195 mmol) in CH$_2$Cl$_2$ (5.0 ml). was slowly added a solution of N-bromosuccinimide (NBS) (38.1 mg, 0.214 mmol) in CH$_2$Cl$_2$ (3.0 ml) and gently refluxed for 4 hours under nitrogen atmosphere. After the reaction was quenched with acetone, the solvent was removed under reduced pressure. The residue was purified by column chromatography (silica gel) using hexanes as eluent to afford fluorescent yellow solid product 10-Bromo-N,N-bis(4-hexylphenyl) anthracen-9-amine) (formula (VI)) (110.7 mg, 96%). $^1$H NMR (400 MHz, CDCl$_3$) δ 8.59 (d, J=8.9 Hz, 2H), 8.16 (d, J=8.8 Hz, 2H), 7.64-7.53 (m, 2H), 7.46-7.35 (m, 2H), 6.94 (s, 8H), 2.47 (t, J=8.0 Hz, 4H), 1.54-1.47 (m, 4H), 1.35-1.19 (m, 12H), 0.92-0.79 (m, 6H). $^{13}$C NMR (101 MHz, CDCl$_3$) δ 145.5, 138.3, 135.7, 131.7, 129.0, 128.4, 127.2, 126.8, 125.1, 120.0, 35.2, 31.7, 31.4, 29.0, 22.6, 14.1. ESI(MS): m/z: Calcd for C38H43N: 592.7 [M]$^+$ Found: 593.4.

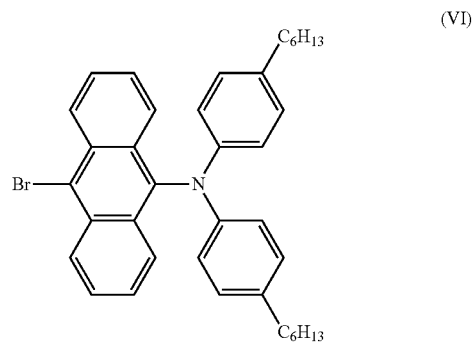

A solution of the compound (VI) (100.0 mg, 0.169 mmol), (trimethylsilyl)acetylene (82.9 mg, 0.844 mmol), Pd(PPh$_3$)$_2$Cl$_2$ (11.8 mg, 0.017 mmol) and CuI (3.3 mg, 0.017 mmol) in a mixture of THF (4.0 ml) and NEt$_3$ (1.0 ml) was gently refluxed for 12 hours under nitrogen atmosphere. The solvent was removed under vacuum. The residue was purified by column chromatography (silica gel) using hexanes as eluent give a yellow oil product N,N-Bis(4-hexylphenyl)-10-(trimethylsilyl)ethynylanthracen-9-amine) (formula (VII)) (48.4 mg, 47%). $^1$H NMR (400 MHz, CDCl$_3$) δ 8.72 (d, J=8.7 Hz, 2H), 8.22 (d, J=8.7 Hz, 2H), 7.60 (dd, J=8.0, 7.1 Hz, 2H), 7.49-7.40 (m, 2H), 7.02 (s, 8H), 2.54 (t, J=8.0 Hz, 4H), 1.66-1.56 (m, 4H), 1.42-1.31 (m, 12H), 0.98-0.89 (m, 6H), 0.55-0.49 (m, 9H). $^{13}$C NMR (101 MHz, CDCl$_3$) δ145.6, 139.0, 135.6, 134.1, 130.4, 129.0, 127.4, 126.7, 125.0, 120.1, 106.9, 101.6, 35.2, 31.7, 31.4, 29.0, 22.6, 14.1, 0.3. ESI(MS): m/z: Calcd for C43H51NSi: 610.0 [M]$^+$ Found: 609.5.

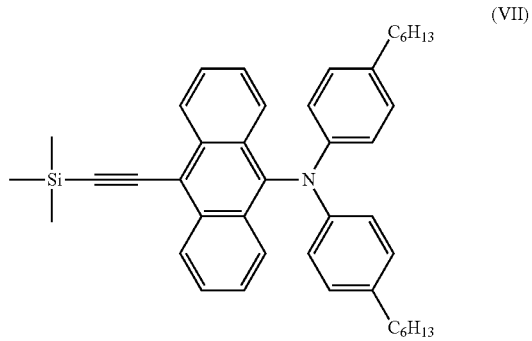

To a solution of the compound (VII) (115.7 MG, 0.190 mmol) in dry THF (3.0 ml) was added tetrabutylammonuium fluoride, TBAF) (248.0 mg, 0.948 mmol). The solution was stirred at room temperature for 30 min under dinitrogen. The mixture was quenched with H$_2$O and then extracted with CH$_2$Cl$_2$. The organic layer was dried over anhydrous MgSO$_4$ and and the solvent was removed under vacuum. A Schlenk tube with the deprotected intermediate was charged with 4-iodobenzoic acid (138.4 mg, 0.558 mmol), Pd$_2$(dba)$_3$ (17.0 mg, 0.019 mmol) and AsPh$_3$ (56.9 mg, 0.186 mmol). The mixture was dissolved in a degassed mixture of THF (10.0 mL) and NEt$_3$ (2.0 mL) and gently refluxed for 4 h under nitrogen atmosphere. The solvent was removed under vacuum and the residue was purified on a column chromatograph (silica gel) using CH$_2$Cl$_2$/CH$_3$OH (20/1) as eluent. Removal of solvent under reduced pressure and recrystallization from CH$_2$Cl$_2$/CH$_3$OH gave an orange solid, i.e. 4-[N,N-Bis(4-hexylphenyl)-10-(trimethylsilyl) ethynylanthracen-9-amino]benzoic acid with the formula (III) (75.8 mg, 62%). $^1$H NMR (400 MHz, CDCl$_3$) δ 8.69 (d, J=8.8 Hz, 2H), 8.23 (d, J=8.0 Hz, 2H), 8.16 (d, J=8.7 Hz, 2H), 7.88 (d, J=8.1 Hz, 2H), 7.61-7.48 (m, 2H), 7.46-7.34 (s, 2H), 6.95 (s, 8H), 2.48 (t, J=8.0 Hz, 4H), 1.60-1.49 (m, 4H), 1.38-1.22 (m, 12H), 0.91-0.83 (m, 6H). 13C NMR (101 MHz, CDCl$_3$) δ 145.6, 139.6, 135.7, 134.0, 131.6, 130.5, 130.4, 129.0, 127.2, 126.9, 126.8, 125.2, 120.1, 116.4, 100.4, 89.9, 35.2, 31.7, 31.5, 29.1, 22.6, 14.1, 1.0. ESI (HRMS): m/z: Calcd for C$_{47}$H$_{47}$NO$_2$: 657.3601 [M]$^+$ Found: 657.3594.

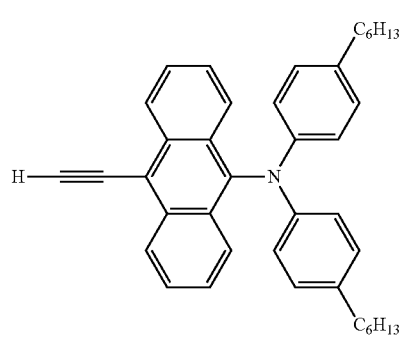
(VIII)

In case that the photosensitive organic dye is used in a solar cell, the voltage is higher than the conventional solar cell (e.g. 0.75V). More especially, the solar cell containing the photosensitive organic dye represented by the following formula (III), (IX), (X) and (XI) has a voltage more than 0.8V.

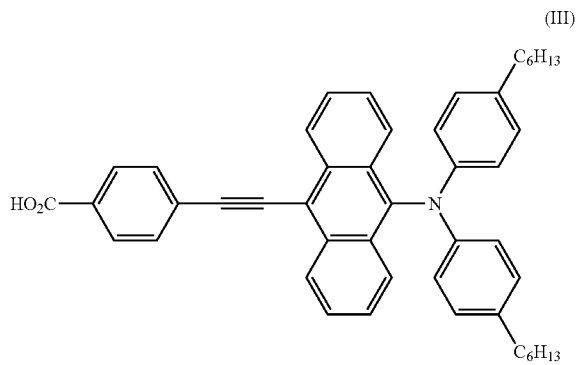
(III)

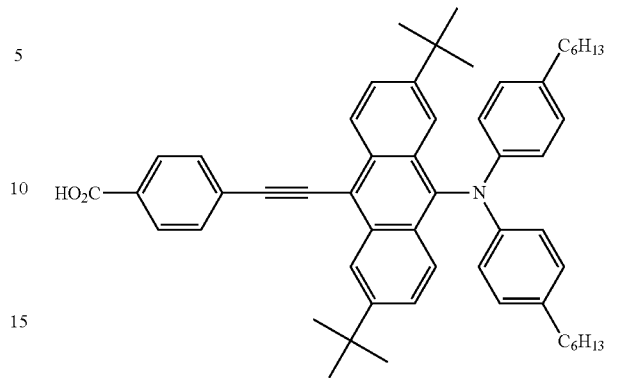
(IX)

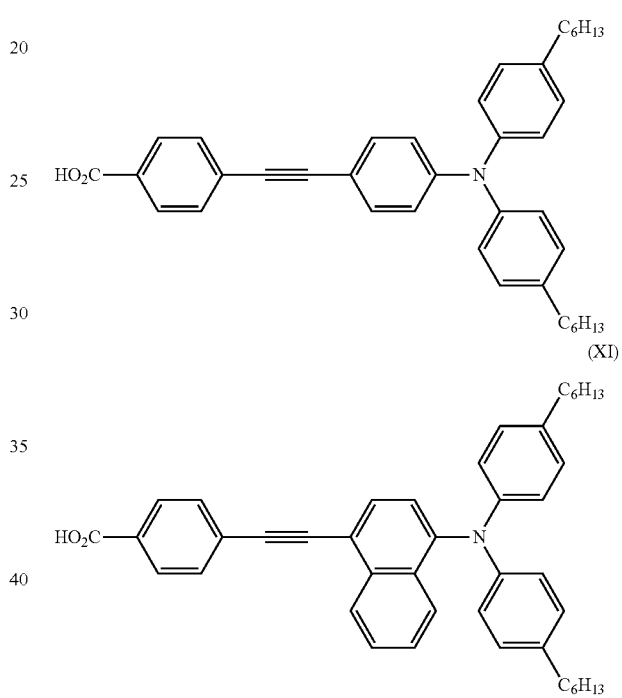
(X)

(XI)

From the above descriptions, the present invention provides a photosensitive organic dye and a dye-sensitized solar cell. The photosensitive organic dye is an arylamine-based dye. The dye-sensitized solar cell containing the photosensitive organic dye is cost-effective and can be easily produced at low temperature. Moreover, since the dye-sensitized solar cell can generate a high voltage and have flexible, colorful and transparent properties, the applications are more extensive. For example, by specially selecting the composition of the photosensitive organic dye, the dye-sensitized solar cell may possess the translucent properties. Consequently, the dye-sensitized solar cell may be used as the construction material of glass curtain wall buildings while possessing the light-shading, heat-insulating and power-generating functions. In case that the dye-sensitized solar cell is applied to the electronic device requiring lower power, the dye-sensitized solar cell is more competitive.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A photosensitive organic dye for a photoelectric converting device, the photosensitive organic dye having a structural formula (I):

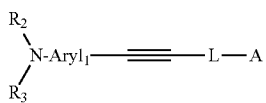
(I)

where,

Aryl₁ is selected from one of the following formulae:

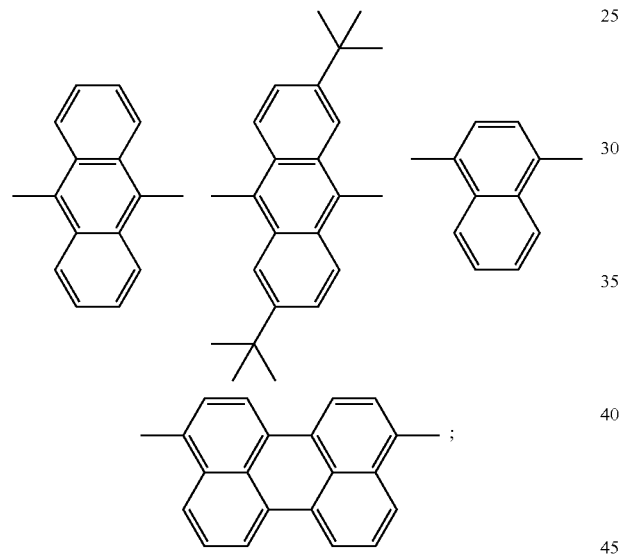

the electron-donating group $NR_2R_3$ is selected from one of the following formulae:

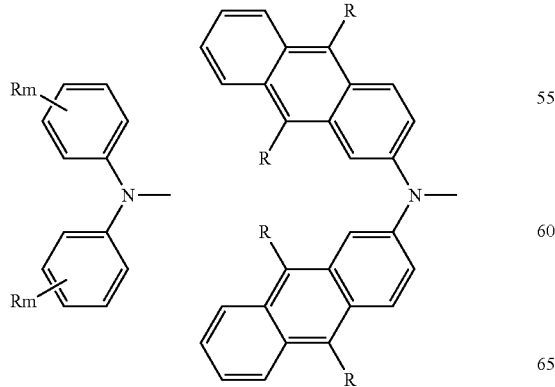

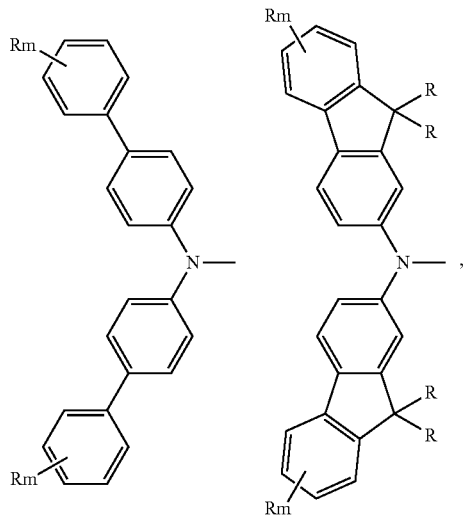

where, $R=C_nH_{2n+1}$ or $OC_nH_{2n+1}$, n=1-12, and m=1-5;

the linker unit L is selected from one of the following formulae:

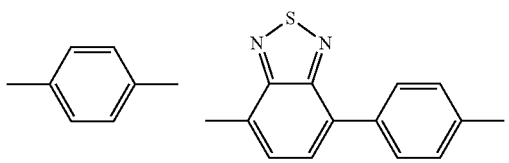

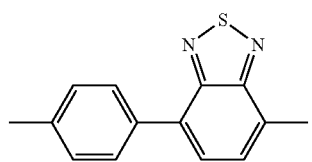

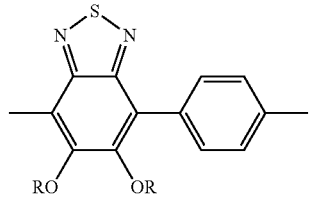

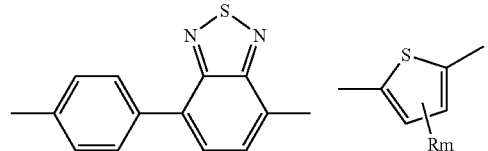

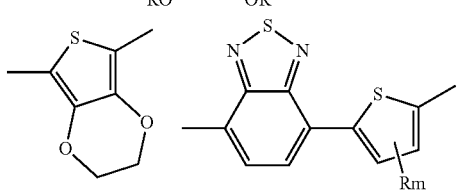

-continued
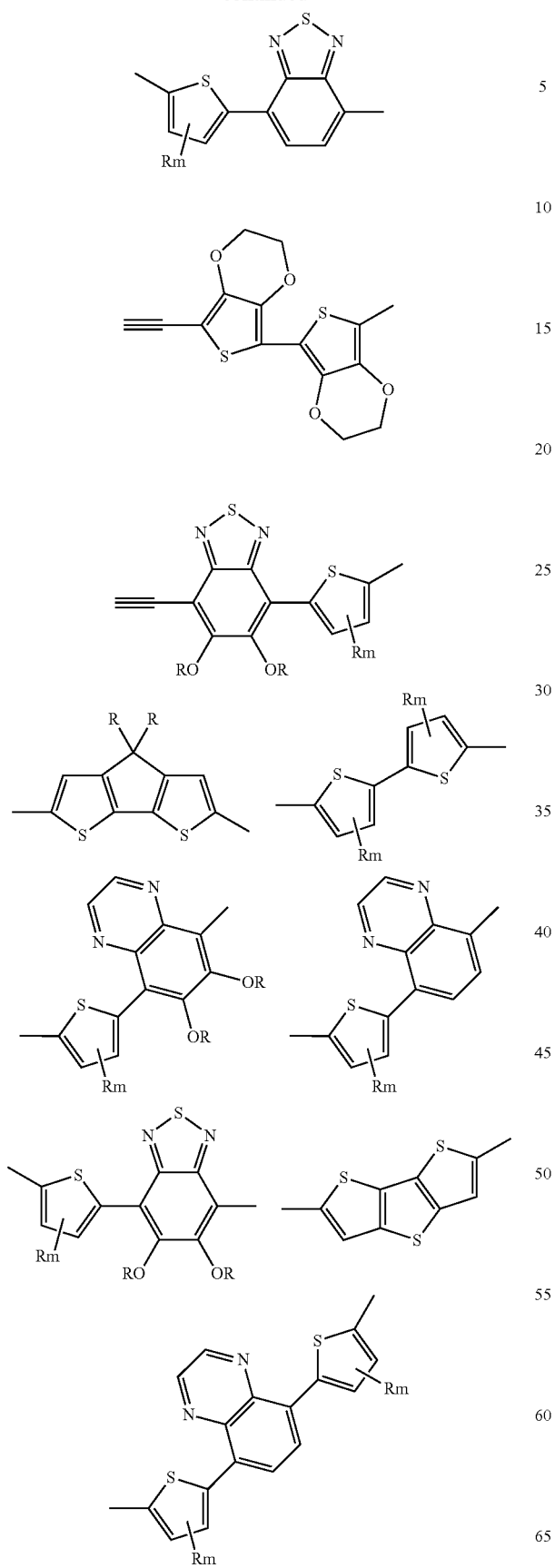
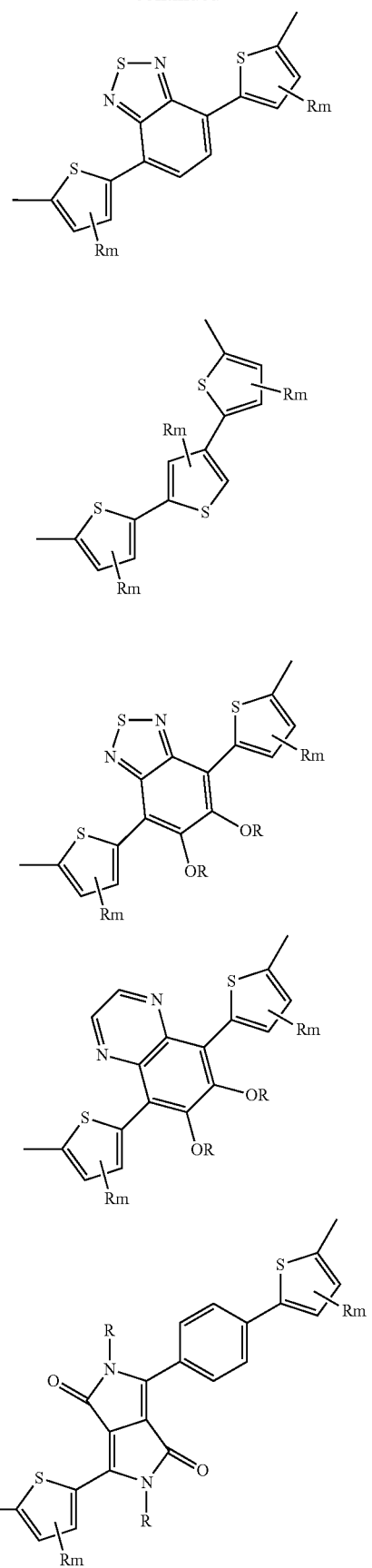

-continued

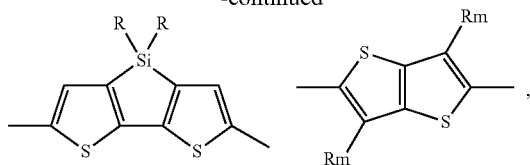

where, $R=C_nH_{2n+1}$, n=0-12; m=0-2; and
the electron-withdrawing group A is selected from one of the following formulae:

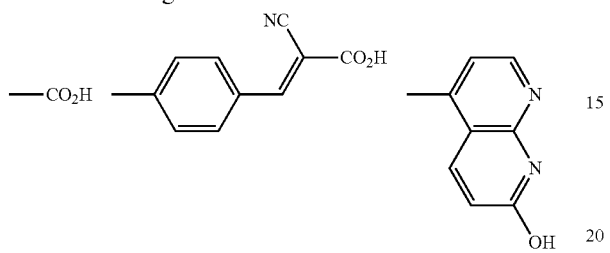

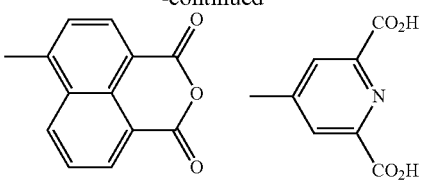

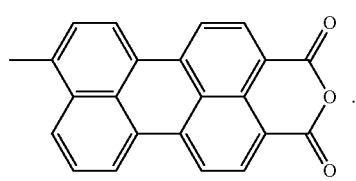

2. A photosensitive organic dye having the following structural formula:

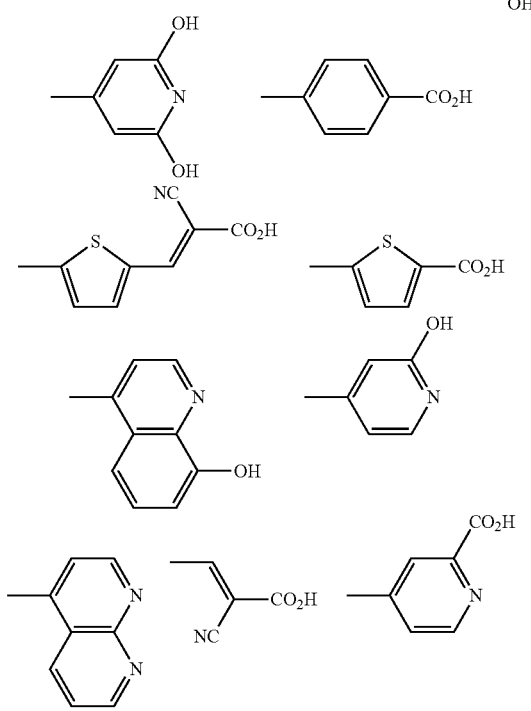

3. A dye-sensitized solar cell containing the photosensitive organic dye according to claim 1, wherein the photosensitive organic dye is coated on a semiconductor film and used as a photosensitizer.

* * * * *